United States Patent [19]

Yamada et al.

[11] 4,045,412

[45] Aug. 30, 1977

[54] ALUMINA SUBSTRATE AND METHOD OF MANUFACTURING SAME

[75] Inventors: Seiichi Yamada, Machida; Kyohei Murakawa, Yokohama, both of Japan

[73] Assignee: Fujitsu Limited, Kawasaki, Japan

[21] Appl. No.: 595,703

[22] Filed: July 14, 1975

[30] Foreign Application Priority Data

July 16, 1974 Japan ................... 49-81296

[51] Int. Cl.$^2$ ................... C04B 35/64; C04B 35/10
[52] U.S. Cl. ................... 264/63; 106/65; 106/73.4; 264/102
[58] Field of Search ................... 106/73.4, 65; 264/63, 264/65, 102

[56] References Cited

U.S. PATENT DOCUMENTS

| | | | |
|---|---|---|---|
| 3,026,210 | 3/1962 | Coble | 106/73.4 |
| 3,141,786 | 7/1964 | Bugosh | 106/73.4 |
| 3,311,482 | 3/1967 | Klingler et al. | 106/73.4 |
| 3,698,923 | 10/1972 | Stetson et al. | 106/73.4 |
| 3,854,965 | 12/1974 | Niwa et al. | 106/73.4 |

*Primary Examiner*—Winston A. Douglas
*Assistant Examiner*—Mark Bell
*Attorney, Agent, or Firm*—Staas & Halsey

[57] ABSTRACT

An improved alumina substrate comprising alumina and magnesium oxide has a surface finish of no more than 0.05 μm CLA and a density of at least 3.90 g/cm$^3$ in an as-fired condition and is composed of alumina grains which are sufficiently grown to have straight grain boundaries and flat surfaces to form a surface of the substrate. The improved substrate is produced by firing a green sheet having a high content of raw material powder and a density of more than 2.60 g/cm$^3$ at a temperature of 1525° to 1650° C. The green sheet with high density is formed by the process of aggregating an organic agent and a high purity alumina powder by dry milling and casting the resultant slip.

13 Claims, 10 Drawing Figures

ALUMINA SUBSTRATE AND METHOD OF MANUFACTURING SAME

BACKGROUND OF THE INVENTION

1. Field of the invention

This invention relates to alumina ceramics. More particularly, the invention relates to an alumina substrate, having a very smooth surface and high density in an as-fired condition, useful as an insulating substrate in electronic devices.

2. Description of the Prior Art

Recently, ceramics, particularly alumina ceramics, have been widely used as substrate material in microelectronic components with resulting improvements in high speed operation characteristics and high density mounting. The surface smoothness characteristic of this substrate is considered important, in addition to the electric, mechanical and thermal characteristics. Particularly in a thin film hybrid integrated circuit, smoothness of the substrate surface is very important. Some previously used ceramic substrates with smooth surfaces have been obtained by glazing. However, such glazing substrates are inferior in electrical and thermal characteristics and, in addition, are very expensive. Therefore, it is desired that a substrate be economically produced and have a surface smooth enough to allow circuit components and thin films of very fine pattern to be directly formed thereon, without glazing. Another method of forming a smooth surface on an alumina substrate involves grinding the substrate after it is fired. However, since the alumina ceramic is very hard, grinding is impractical. For this reason, it is desired that an alumina ceramic substrate be developed which can provide a surfficiently smooth surface, even in an as-fired condition.

In general, the manufacturing methods of alumina ceramics are classified into the following two methods; one is the dry press method wherein a mixture of alumina powder and binder is fired after being pressed mechanically; and the other is the wet casting method wherein an organic agent consisting of binder, plasticizers, deflocculents and solvents are added to the alumina powder and this combined material is formed into a slip. Then, a green sheet, obtained by casting this slip, is fired. Among these two methods, the dry press method is most likely to lose smoothness of the ceramic surface, and for that reason, the wet casting method is employed for obtaining an alumina ceramic substrate having a smooth surface.

An alumina substrate having a smooth surface is obtained by the following manufacturing process. Various kinds of metal oxide powders are added to high purity and fine alumina powder as the grain growth inhibitor, for obtaining a raw material powder. An organic agent consisting of binder, plasticizers, deflocculents and solvents is added. The combined material is then thoroughly mixed with a ball mill. Thus, the resulting slip contains a large amount of powder. The slip is then formed into a thin hard sheet on a material having a smooth surface, such as a polyester film, by using a so-called doctor-blade. This wet casting method is called the slip casting or tape casting method. Thereafter, the sheet is dried into a solvent-free green sheet. After removing an organic component in the green sheet, as required, by means of calcine, the green sheet is fired under air or hydrogen atmosphere conditions. The green sheet obtained by the above process prior to firing has a very smooth reflecting surface. However, it is degraded, due to the grain growth of the alumina during firing. Thus, control of the firing atmosphere conditions, firing temperature and firing time is required in order to prevent grain growth of alumina. For example, as described in the specification of the U.S. Pat. No. 3,698,923, the firing temperature is selected in that method to be as low as 1425° to 1500° C. Although an alumina substrate fired in such a low temperature has indeed considerable surface smoothness, it has the disadvantage of developing a large number of pores because of insufficient grain growth and therefore, suffers from a low density. Therefore, such a method makes it possible to produce alumina ceramic substrates having both excellent thermal conductivity and dielectric characteristics.

In order to eliminate the above disadvantage, U.S. Pat. No. 3,854,965 proposes a method to add a small amount of chromium oxide ($Cr_2O_3$) and magnesium oxide (MgO) as grain growth inhibitor to the high purity alumina powder, when manufacturing an alumina substrate by the wet casting method. In that patent, the raw sheet is fired at a temperature of 1600° C in a hydrogen atmosphere and an alumina substrate having a fine and excellently smoo.h surface is obtained. That temperature is higher than the firing temperature in manufacturing existing alumina substrates having supersmooth surfaces but lower than the firing temperature (1700° C) in manufacturing high density and hard alumina ceramics used for jigs. Generally, improvement in the surface smoothness characteristics of alumina substrates and high density characteristics are contradictory to each other and are largely dependent upon the firing temperature. The major advantage of the above method lies in solving such discrepancies by mixing the chromium oxide and magnesium oxide, and promoting high density of the alumina ceramics without sacrificing smoothness. However, if the chromium oxide is added and the firing is performed in an atmosphere of air, conditions develop as in the case of the earilet cited method. The prevention of degradation of surface smoothness due to firing cannot be obtained and the alumina substrate becomes colored dark brown. For this reason, in the above method, it is necessary to perform the firing under a hydrogen ambient atmosphere and, as a result, it is difficult to economically manufacture the desired alumina substrate.

Moreover, in such a method, the desired amount of chromium oxide to be added is about 0.02 to 0.03 wt% against the alumina powder and this amount is by far less than that of the metal oxide (0.1 to 0.5 wt%) which is well known as a grain growth inhibitor. This minute amount of chromium oxide has little function as a grain growth inhibitor but has a special function to flatly orient the grown alumina grain. In order that such minute amount of chromium oxide be capable of producing such a result, it is necessary to use the alumina powder having a purity of 99.99% or better. Therefore, in the above method, very expensive alumina powder obtained by means of the non-Bayer process, such as Linda A marketed by Union Carbide Co., is required. Consequently, excellent surface smoothness cannot be obtained by the above method of U.S. Pat. No. 3,854,965 when the moren economical alumina powder, with purity of about 99.5% and produced by the Bayer process is used.

Furthermore, in the above method, the formation of the ceramic substrate is accompanied by large shrinkage with sufficient grain growth for high density. As a result, a holding plate, which is mounted on the green sheet or the calcined substrate for the purpose of eliminating curvature of substrate at the time of firing, may cause damage to the substrate surface due to friction.

SUMMARY OF THE PRESENT INVENTION

An object of the present invention lies is to provide an economical alumina substrate having a very smooth surface and high density.

Another object of the present invention is to provide an alumina substate having super-smoothness of surface and high density without the addition of chromium oxide.

Other objects of the present invention are to provide alumina substrate composed of alumina formed by the econmical Bayer process and having a super-smooth surface and high density.

Still another object of the present invention is to provide an alumina substrate showing little or no shrinkage during the firing step of its manufacturing method.

A further object of the present invention is to provide an alumina substrate which does not degrade surface smoothness even if it is subject to firing under atmospheric ambient (air) conditions.

The alumina surface provided by the present invention has, in the fired condition, a density of at least 3.90 g/cm$^3$ and a surface finish no greater than 0.05 $\mu$m CLA (Center Line Average) on at least one major surface. This alumina surface is composed of alumina grains being sufficiently grown, having flat surfaces and straight grain boundaries; and consists essentially of alumina with a grain growth inhibitor of 0.1 to 0.5 wt%. Preferrably, this grain grown inhibitor is magnesium oxide (M$_g$O). The average size of the said alumina grains is in the range of 1.6 to 4.0 $\mu$m.

The alumina substrate provided by the present invention can be manufactured by the following process: a green sheet is manufactured first by the slip casting method, where the raw material powder consisting of high purity and fine alumina particles and grain growth inhibitor are packed with particularly high density; then the green sheet is fired at a temperature of 1525° C to 1650° C so that the alumina particles are grown by 3 to 8 times. In the present invention, it is very important to manufacture a green sheet having high powder content where the raw material powder, which consists of high purity alumina powder and the grain growth inhibitor, is packed with very high density. More specifically, it is desirable to prepare a green sheet having a density of more than 2.60 g/cm$^3$, and preferably more than 2.65 g/cm$^3$. It has been clear that when such a high density green sheet is fire within the said temperature range for obtaining sufficiently grown alumina particles, the alumina grains at the substrate surface are flatly oriented and the grain boundaries become linear. Such orientation of the alumina grain prevents deterioration of surface smoothness resulting from growth of the alumina grain boundaries show that the alumina substrate has a high density and is stable.

According to the present invention, the high density green sheet where the raw material powder is packed with high density can be made by thoroughly dry milling the raw material powder without using a grinding additive. In the present invention, this dry milling is employed for realizing aggregation of the raw material powder, which is generally considerable undesirable. It has also been made apparent by the present invention that the slip made by mixing the sufficiently aggregated raw material powder and the organic agent allows the alumia particles to be uniformly dispersed therein and therefore it is possible to obtain a green sheet having a large content of the raw material powder packed with excessively high density. Since the above dry milling is not intended to have a grinding effect, the grinding additive is not used and milling is performed by feeding a larger amount of raw material into the ball mill.

An organic, agent consisting of solvent, binder, deflocculent and plasticizer is added to the aggregated raw material powder obtained by dry milling, and they are thoroughly mixed. Thus, a slip is manufactured. Manufacturing of this slip shall be performed with sufficient care. Also, sufficient consideration is taken for the composition of this organic agent so that the green sheet obtained after the slip casting shows both a high content of raw material powder and a high density. For this invention, it is essential to manufacture a green sheet having a high density of at least 2.6 g/cm$^3$, or preferably 2.65 g/cm$^3$. The high density green sheet is fired for several tens of minutes to several hours under a temperature within the range from 1525° C to 1650° C and becomes the alumina substrate.

The details of the manufacturing process for the alumina substrate relating to the present invention are made clearer by the following explanation.

DETAILED DESCRIPTION OF THE INVENTION

It is known that the smaller the particle size of the raw material powder (i.e., the larger the surface area) the more improved the sintering property of ceramics. It is necessary to use fine alumina powder to obtain a high density ceramic substrate when firing at a comparatively low temperature (from 1525° C to 1650° C), and excessive grain growth does not occur because of an improvement in the sintering property. Deterioration of surface smoothness due to excessively large alumina grains is thereby prevented. The generally used alumina powder excelling in sintering property is mainly comprised of the α-alumina containing several percents of γ-alumina and has alumina particles with surface area of more than 5 m²/g, that is, in terms of the average particle size of less than 0.8 μm. Therefore, the manufacturing method in the present invention conforms to the conventional method to the extent of using a fine alumina powder.

The alumina formed by the Bayer process is disirable for the present invention. Such alumina, having an average particle size of 0.5 μm and a purity of 99.5% is marketed by Alcoa Co. under the name of Alcoa A-16.

A desirable raw material powder is composed of a high purity, fine alumina powder as mentioned above and a minute amount of grain growth inhibitor (0.1 to 0.5 wt%). The grain growth inhibitor suppresses abnormal grain growth during firing and allows all the alumina particles to grow uniformly. Therefore, the use of the grain growth inhibitor is essential for protecting the alumina surface from becoming rough due to abnormal growth of a part of the particles. Various kinds of metal oxides are known as grain growth inhibitors, but magnesium oxide (MgO) is most preferable. On the other hand, a grain growth inhibitor which includes silicon oxide is not preferable, since it has a harmful effect on smoothing the surface of the alumina substrate. The fine magnesium oxide (MgO) powder grain growth inhibitor is added so that it is contained in the raw material powder with wt% of 0.1 to 0.5.

The sintering property of the green sheet is not only dependent on the particle size of the raw material powder, the purity and the presence or not of the grain growth inhibitor, but also the density, of the green sheet. It is known that the higher the density, the more improved the sintering property. Where the density of the green sheet is high, the number of pores generated between grains after removal of the organic agent by calcine naturally becomes small, and thereby the density of the ceramic after sintering is improved together with good sintering property. On the other hand, the degree of alumina grain growth due to firing is dependent on the firing temperature and the firing period. The higher the firing temperature, or the longer the firing period, the more distinctive is the grain growth. However, there is naturally a practical limit on the firing period and manufacturing cost. From the practical viewpoint, the firing period of several minutes to several hours is considered desirable since the grain growth is more largely dependent on the firing temperature. Therefore, it can be concluded from the practical view point that the rate of grain growth is largely dependent on the firing temperature. These facts are utilized in the method disclosed in the specification of the said U.S. Pat. No. 3,698,923. Therein, the sintering property is improved by using a green sheet containing fine alumina particles. Therefore, sintering at a temperature which causes no large grain growth becomes possible and a ceramic substrate having a smooth surface can be manufactured with the particle size in the powder condition. However, the density of the resulting substrate is low. The most preferable firing temperature of this ceramic substrate is at 1425° C and a firing temperature higher than 1500° C is thought to drastically degrade the surface smoothness of the substrate.

The complicated addition of a minute amount of chromium oxide and magnesium oxide in the method of said U.S. Pat. No. 3,854,965 is for the purpose of eliminating the above disadvantage, wherein the density of the ceramic substrate obtained by low temperature firing is low. This method produces grown alumina particles having a flat surface; and this flat surface has the function and effect to orient each particle so that the flat surface thereof coincides with the surface of the substrate.

As a result, deterioration of surface smoothness caused by grain growth is blocked and at the same time condensation of substrate is promoted. The density of the green sheet in these methods is usually 2.2 g/cm³, and at most 2.4 g/cm³.

The present invention has been brought about by discovering the fact that a green sheet with exceedingly high density of more than 2.60 g/cm³, particularly 2.65 g/cm³ can serve as an alumina substrate. The high density green sheet of this invention can be manufactured by the following process. A slip obtained by adding an organic agent (essentially, the binder and solvent) to the raw material powder is formed into a sheet, from which a solvent is vaporized under the temperature range from a room temperature of 80° C. The solvent is removed from the green sheet leaving it as a flexible leather-like hard sheet which contains the raw material powder and an organic agent consisting of binder, plasticizers and deflocculents.

In general, this solvent free green sheet is adjusted so that it contains no more than 20 wt% of the organic agent, or binder. In manufacturing the green sheet the organic agent comprises polyvinyl alcohol, polyvinyl butyral (a copolymer of vinylchloride) and vinylacetate as the binders; phthalic ester as the plasticizer; and stearic acid, polyoxyethylene nonyl phenyl ether, sorbitan sesquioleate or sorbitan trioleate as the deflocculent. The density of the green sheet with not quite differ according to the composition of the organic agent. As long as the packing density of the organic agent and the raw material powder in the green sheet are the same, the degree of packing density of the raw material powder in the green sheet will correspond to the density of the green sheet. In order to attain the objects of the present invention, it is necessary to use such a high density green sheet, as produced by packing the raw material powder with exceedingly high density.

In order to increase the density of the green sheet, it is not only necessary to decrease the content of the organic component in the green sheet, but it is also essential to obtain a green sheet having as few bubbles as possible by packing the raw material powder and the organic agent with very high density. One example of such a green sheet has a content of organic agent only 10 wt%. However, the density of the green sheet of this type is only about 2.2 g/cm³ and it is obvious that the green sheet of this kind includes a large amount of bubbles, since the theoretical density of the alumina ($Al_2O_3$) is 3.99 g/cm³. According to experiments by the inventors of the present invention a green sheet with a density of more than 2.65 g/cm³ is obtained when the content of the organic agent in the green sheet is less than 18 wt% and when the raw material powder and the organic agent are almost perfectly packed with a high density, or when there are few pores in the green sheet containing the organic agent in the amount of from 13 to 15 wt%. In order to manufacture a green sheet with a high density including a large content of powder, it is very important to uniformly disperse the raw material powder in the slip by adding an organic agent, consisting of the binder, plasticizer, deflocculent and solvent, into the raw material powder. The composition and milling condition of the organic agent in the green sheet gives influence not only on the density of the green sheet but also on its usability. Therefore, the composition of the organic agent has to be adjusted so that such a green sheet is obtained which does not crack, has less viscosity and sufficient flexibility.

In order to manufacture a green sheet satisfying the abovementioned requirements, sufficient care must be taken as to the nature of the raw material powder itself, composition and content of the organic agent, and the mixing method used. Described hereunder, is a method to obtain such a high density green sheet.

Some of the alumina powder currently marketed are ground (super ground) to a condition where the alumina particles are individually separate, while some others are in a condition such that several alumina particles form a solid. For unground alumina powder, grinding by a ball mill utilizing an alumina ball is effective. Concerning this point, it is pointed out in the specification of the said U.S. Pat. No. 3,698,923 that wet mixing after adding a liquid carrier such as trichloroethylene to the raw material powder will improve the surface smoothness of the substrate after firing. It is also concluded that the effect of such improvement in surface smoothness can be found in increased surface area obtained due to grinding of the alumina powder. According to experiments by the inventors of the present invention, it has become obvious that sufficient aggregation of raw material powder by dry milling is very effective for any of powders mentioned above to obtain uniform dispersion of raw material powder in the slip and to improvement the density of the green sheet produced therefrom. When performing dry milling for fine powder with the ball mill, the grain particles are aggregated and a phenomenon called "mill packing" occurs. Generally, "mill packing" is considered inconvenient during the manufacture of alumina substrate, since grinding is terminated thereby. Therefore, when grinding is carried out with a ball mill, "mill packing" is eliminated by either adding a small amount of grinding additives such as stearic acid and oleic acid and at the same time utilizing an alumina ball weighing 10 times the weight of the powder, or by wet milling under the existence of alcohol or water. However, dry milling is outstandingly effective for uniformly dispersing the raw material powder in the slip, and is not intended for the grinding effect but for the aggregation effect. Therefore, dry milling by using a ball mill is carried out without adding any grind additive but with the weight of the alumina ball being from 1 to 8 times or preferentially 3 to 4 times the weight of the raw material powder. As a result, the raw material powder is thoroughly aggregated. When the period of this dry milling is more than 10 hours, the effect of improvement in dispersion of the raw material powder in the slip becomes distinctive and even more so when the dry milling period is more than 40 hours.

Figure 1:
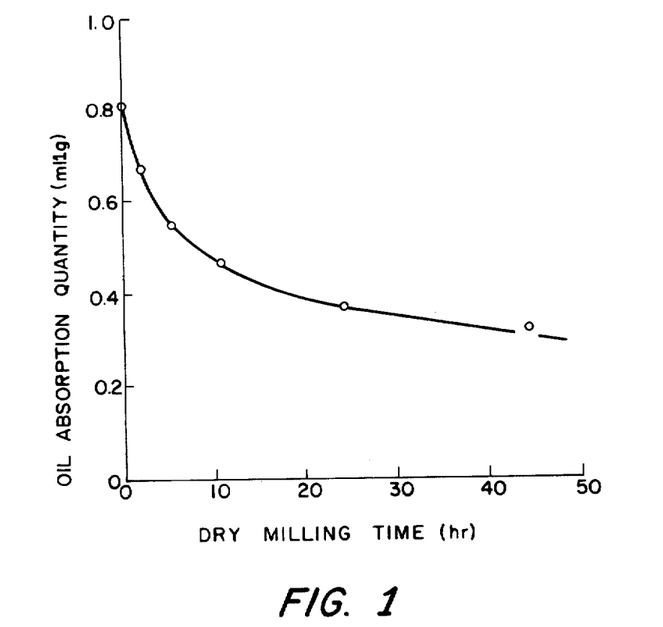
FIG. 1 is a graphical presentation showing the relation between the dry milling time for the alumina powder and the linseed oil absorption of the resultant alumina powder.
Figure 2:
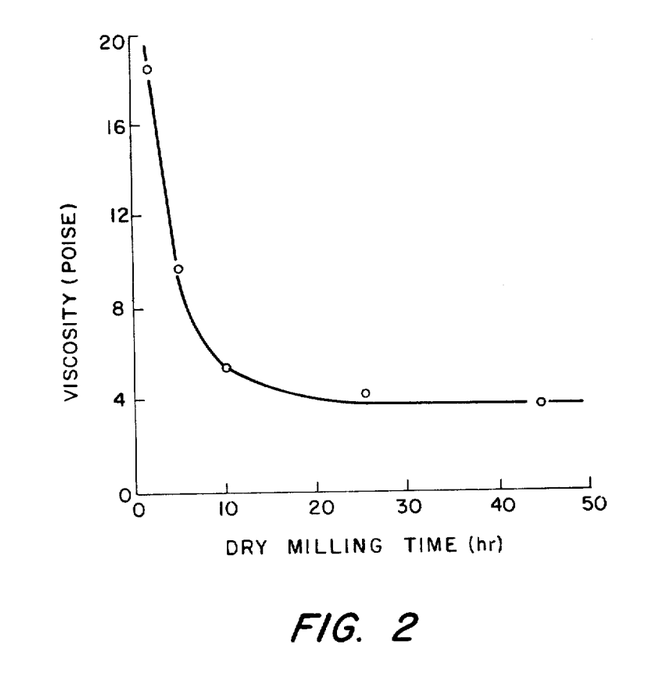
FIG. 2 is a graphical presentation showing the relation between the dry milling time for the alumina powder and the viscosity of the slip manufactured from the resultant alumina powder.

The following is an explanation of an experiment which clarifies the effect of dry milling. Alumina powder such as α-alumina ($Al_2O_3$) powder (marketed by Union Carbide Co. with the name of Linde A) having the surface area of 15 m²/g and an average particle size of 0.3 μm is used. Dry milling is performed by putting 100 parts of above alumina powder (hereinafter the term "parts" means the weight parts) and 250 parts of high purity alumina ball of 15 mmφ (purity: 99.5% or more) into the mill pot made of polyethylene and rotating this mill pot at a speed of 70 to 80 rpm. Several runs were made, wherein the dry milling period was changed and linseed oil was added to the raw material powder while milling, thus the amount of linseed oil required for obtaining a specified viscosity was measured. FIG. 1 shows the result of this measurement. The horizontal axis corresponds to the dry milling period, while the vertical axis, to the amount of linseed oil absorbed. From this figure, it is apparent that powder which has been subjected to the dry milling or more than 10 hours shows a small amount of absorption. In addition, the same organic agent was added to each of the raw material powders subjected to the dry milling for different periods. The obtained mixtures were then further subjected to milling with the ball mill for 120 hours resepectively. The viscosity of the slips obtained after above the processes was measured. FIG. 2 shows the results of those measurements. From FIG. 2, it is apparent that those mixtures subjected to the dry milling for more than 10 hours show little viscosity and therefore dispersion of alumina powder in the slip is satisfactory. By using the raw material powder subjected to such dry milling, a green sheet is obtained which is difficult to break down. Since the content of the organic agent is small, a green sheet with a large content of the alumina powder is obtained.

The composition of the organic agent shown below is described in the specification of the U.S. Pat. No. 3,854,965 and is the preferred one.

Deflocculent: Uniform dispersion of raw material powder in the slip is assisted by the deflocculent and is a very important factor for improving in the density of the green sheet. Sorbitan sesquioleate or sorbitan trioleate, which are neutral surface active agents having affinity with oil, are the most preferential choices for a deflocculent. It is best to add about 1 part of this deflocculent to 100 parts of the raw material powder.

Binder: It is clear that the binder, polyvinyl butyral (PVB) is suitable and moreover it is apparent that distribution of the molecular weight of the PVB gives large influence on preventing cracking of the sheet. In the PVB which serves as the binder suitable to decrease cracking, the buthyral, which is a constituent of the PVB combination having a high average degree of polymerization (adp) of about 1000 to 2000 and a low average degree of polymerization (adp) of about 250 to 500, has extended distribution of molecular weight. By using this buthyral, a flexible green sheet is produced having a strong binding force. The mixing ratio of these two PVBs also gives an influence on generation of cracks of the green sheet and the preferential combination should have the following weight ratio as:

$$\frac{PVB \text{ (adp of 250 to 500)}}{PVB \text{ (adp of 1000 to 2000)}} = \text{values in the range of 1 to 5}$$

The combination of PVBs with a weight ratio of 2.5 produced a green sheet which was the most difficult to break. This binder was added in 5 to 10 parts against 100 parts of the raw material powder.

Plasticizer: As the plasticizer for adjusting the plasticity of a green sheet, the dibutyl phthalate (DBP) was selected and investigations were made on the mixing rate with the binder (PVB). The mixing rate of the DBP and PVB also gives an influence on generation of cracks in the green sheet. The most preferential mixing rate of the DBP and PVB (DBP/PVB) is in a range from 1 to 1.5 (weight ratio). When this value is less than 1, the green sheet is likely to develop cracks. When the ratio exceeds 1.5, viscosity of the sheet increases, resulting in deterioration in usability. The most preferential ratio by weight was 1.3.

Solvent: Various materials are used as the solvent, and their selection depends on the materials used for the binder, the deflocculent and the plasticizer. Here, for example, a combination of methyl ethyl ketone (hereinafter abbreviated as MEK), methanol and butanol can be used. The mixing rate of this solvent of about 2:1:1 by weight ratio of MEK:Methanol:Butanol, is sufficient. The amount of solvent in the slip is not critical and the above solvent is added in 40 to 50 parts against 100 parts of the raw material powder.

The binder, deflocculent and plasticizer in the abovementioned organic agent can be added to the raw material powder until the total amount of them reaches 13 to 18 wt% in the green sheet manufactured later.

The raw material powder aggregated by the dry milling and the above organic agent are thoroughly milled by the ball mill and formed into a slip. This milling is preferably performed for more than 48 hours using a high purity alumina ball. The addition of water to the raw material powder preceding the milling for manufacturing the slip is very effective for uniform dispersion of the raw material powder. It is desirable that the water content of raw material powder be regulated in the range of from 0.3 to 3.0 wt%, and preferably to a range of from 0.5 to 2.0 wt%. The addition of water can also be done before the dry milling mentioned above.

The slip is placed under the vacuum condition of about $10^{-2}$ Torr and bubbles are removed thereby. At the same time the solvent in the slip is gradually removed. When the viscosity becomes appropriate for casting, the slip is taken out from the vacuum condition.

Thereafter, this slip is formed into a sheet on a smooth carrier film by the conventional method. A film of glycal terephthalic acid polyester sold under the trademark Mylar may be used as the carrier. This casted material is dryed in air and further formed into a solvent-free green sheet with a thickness of 0.5 to 1 mm. About 13 to 18 wt% of the organic agent is left in the green sheet and the green sheet density is maintained at more than 2.60 g/cm$^3$, with a density of 2.65 g/cm$^3$ being desirable.

The green sheet is calcined in air at the temperature of 1200° C to 1300° C and thereby the organic agent included therein is removed. The calcined substrate is fired in an air or hydrogen atmosphere at a temperature within the range of 1525° C to 1650° C for several hours with a heat resistant plate having a smooth flat surface placed on the substrate. The firing time and temperature are selected so that the alumina particles can grow to a size of from 3 to 8 times their initial size. The said heat resistant plate also acts as a weight to prevent warping of the substrate during firing. The heat resistant plate is an alumina plate which has been ground smooth at its surface after firing, or a flat and smooth refractory metal plate. Shrinkage of the substrate during firing is rather small in the case of the process of the present invention. Therefore, little damage occurs on the surface due to friction generated between the substrate and the weight resulting from a shrinkage of the substrate during firing. By the abovementioned process, an alumina substrate can be manufactured.

The alumina substrate manufactured by the above process has, in the firing condition, a surface finish of 0.03 to 0.05 μm CLA at the major surface corresponding to the side adjacent to the carrier film of the green sheet. The density of this alumina substrate is at least 3.90 g/cm$^3$ and usually reaches 3.95 to 3.98 g/cm$^3$, which is close to the theoretical density of alumina (3.99 g/cm$^3$). The average size of alumina grain composing this alumina substrate is 1.6 to 4.0 μm. It is indeed a surprising fact that the surface finish of the substrate having such comparatively large average grain size is 0.03 to 0.05 μm CLA. Moreover, in the present invention, this improved alumina substrate can be obtained from alumina powder produced by means of the Bayer process without the addition of chromium oxide. The surface of each alumina grain at the substrate surface is flat and the grain boundary is straight. This fact shows that each alumina grain has grown sufficiently to form a stable alumina ceramic having high density.

Figure 7A:
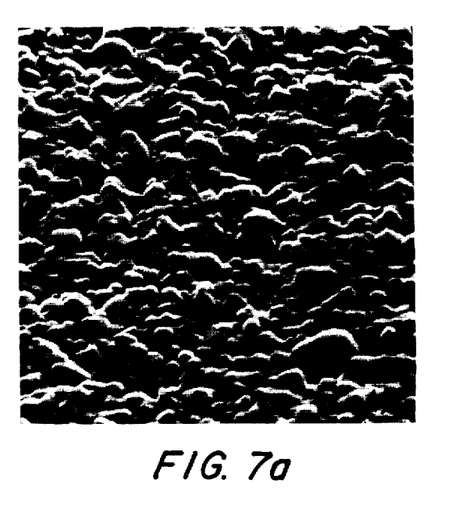
FIG. 7a is a microscopic photograph of an alumina substrate surface produced by firing a low density green sheet with a firing temperature of 1500° C.
Figure 7B:
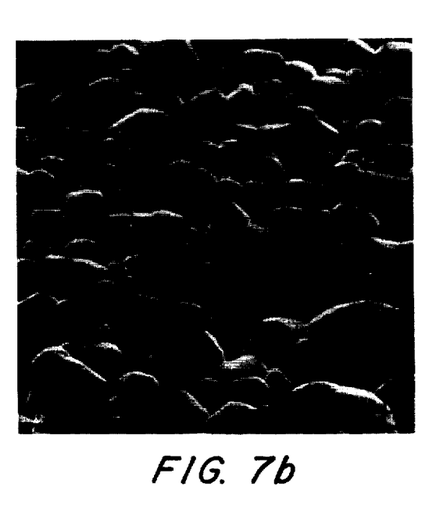
FIG. 7b is a microscopic photograph of an alumina substrate surface produced by firing a low density green sheet with a firing temperature of 1600° C.
Figure 8A:
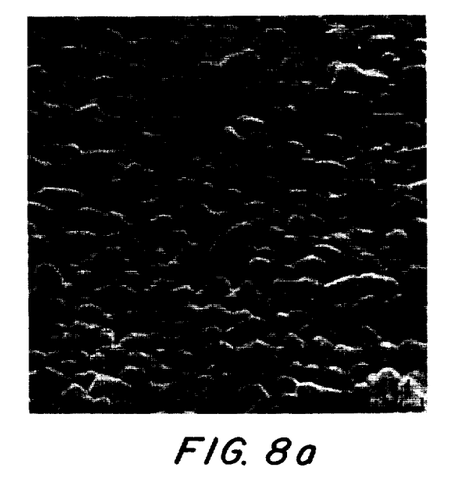
FIG. 8a is a microscopic photograph of an alumina substrate surface produced by firing a high density green sheet with a firing temperature of 1500° C.
Figure 8B:
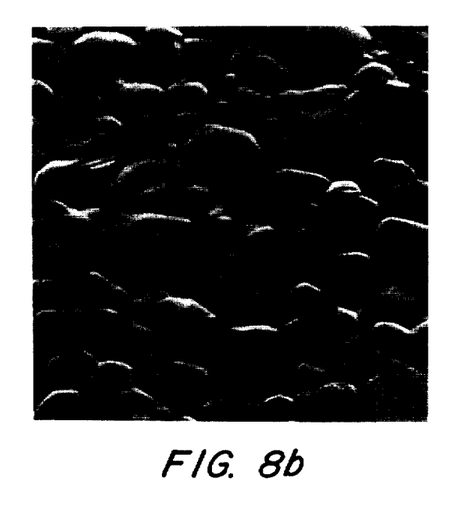
FIG. 8b is a microscopic photograph of an alumina substrate surface produced by firing a high density green sheet with a firing temperature of 1600° C.

FIG. 7b and FIG. 8b are microscopic photographs of alumina substrate surfaces. The conventional alumina substrate shown in FIG. 7b can be obtained by firing a low density green sheet, while the alumina substrate related to the present invention is shown in FIG. 8b and can be obtained by firing a high density green sheet. The firing temperature of these substrates is 1600° C. Details of the manufacturing conditions for these substrates will be made clear in the explanation for an embodiment described later. The conventional alumina substrate shown in FIG. 7b has a surface finish of 0.07 to 0.08 μm CLA and a density of 3.94 g/cm$^3$. On the other hand, the alumina substrate of the present invention is shown in FIG. 8b and has a surface finish of 0.03 to 0.04 μm CLA and a density of 3.97 g/cm$^3$.

The alumina grain growth occurs when the adjacent alumina grains combine with each other and the grain boundary shifts. In addition, grain growth is considered when diffusion of impurities or additives for sintering occur at the grain boundary. Diffusion and surface force of alumina may also play an important role for grain growth. It is also considered that, when the grain boundary becomes straight by means of the above grain growth mechanism and when every alumina grain takes correct hexagonal form a honeycomb structure results, the ideally stable ceramic substrate can be obtained. When making investigation on FIG. 8b from such viewpoint, the ceramic substrate of the present invention is shown to be stable and have a high density since it has straight grain boundaries and the shape of each alumina grain is almost hexagonal. In this substrate, the surface of each alumina grain is almost flat and each grain is oriented so that the flat surface coincides with the direction of major surface of the substrate. Excellent surface smoothness is thereby obtained. However, the precise reason why the alumina grains are oriented like this is still unclear.

The structure of the alumina substrate surface shown in FIG. 8b is similar to that formed by the method disclosed by the U.S. Pat. No. 3,854,965. This structure is almost the same as that of the alumina substrate, which consists of a high purity alumina by the non-Bayer process, and a minute amount of chromium oxide and magnesium oxide. However, the present invention has realized such a fine surface structure on an economical alumina ceramic substrate consisting of the alumina by means of the Bayer process and grain growth inhibitor (MgO).

In the manufacturing process disclosed by the present invention, the addition of chromium oxide in 0.001 to 0.05 wt% into the alumina powder does not give essential influence to the characteristic of resulting alumina substrate.

EMBODIMENT NO. 1

A raw material powder consisting of 100 parts of super ground alumina powder (manufactured by Alcoa Co., under the name A-16SG) having surface area of 10 m$^2$/g and an average particle size of 0.5 $\mu$ along with 0.25 parts of magnesium oxide (MgO) added thereto, as the grain growth inhibitor, were dry milled for 40 hours. The dry milling was performed by putting a high purity alumina ball, of 15 mm$\phi$ and weighing 7.5 kg, and 2.5 kg of the said raw material powder into a 10 l mill pot made of polyethylene. The pot was rotated at a speed of 50 to 60 rpm. An organic agent composition No. 1 (see contents below) and 1 part of water were added to the 100 parts of raw material powder being aggregated by dry milling and these materials were formed into a slip after 100 hours of milling with the ball mill using the alumina ball. In addition, the slip was then subjected to a vacuum for eliminating bubbles. Thereafter, the slip was formed into a sheet and dried at room temperature. Thus, a green sheet was obtained.

| Composition of organic agent No. 1: | |
|---|---|
| Binder: PVB | 7.5 parts |
| Plasticizer: DBP | 10 parts |
| Deflocculent: sorbitan trioleate OP-85R (manufactured and sold by the Nippon Oils and Fats Co., Ltd. of Japan) | 1 part |
| Solvent: MEK | 20 parts |
| Methanol | 12 parts |
| Butanol | 10 parts |

The density of the green sheet manufactured under this embodiment is 2.72 g/cm$^3$ compared with 2.48 g/cm$^3$ for a green sheet manufactured under the same conditions as above, except for dry milling. From this result, it is proved that the dry milling for super ground alumina powder is effective to improve the density of the green sheet.

The density of 2.72 g/cm$^3$ of the green sheet in this embodiment reaches more than 99.5% of the theoretical density obtained when the alumina powder and the organic agent in the green sheet is packed with complete high density. After calcining the green sheet of this embodiment in the air at a temperature of 1300° C for about 1 hour, in order to remove the organic agent, it is fired in an air or hydrogen atmosphere.

For comparison, a green sheet, to which the step of dry milling was not performed, was fired in a hydrogen atmosphere after calcine.

Subsequently, measurements were carried out for surface gloss, weight-specific gravity and flexural strength of the respective alumina ceramic substrates.

In general, surface gloss is known as the value showing gloss of a coating. However, there is a correlation between this gloss and roughness of a surface and therefore it can be used as a simplified suggestion of surface smoothness. The Gloss is represented by the ratio (%) of the intensity of light reflected from the irradiated surface of plate glass having an index of refraction of 1.567 to the intensity of light reflected from the similarly irradiated surface of a specimen. Results of the gloss measurements are shown in Table 1.

TABLE 1

| | Firing condition | Gloss | Weight-specific gravity | Flexural strength (kg, cm$^2$) |
|---|---|---|---|---|
| Substrate for comparison | In hydrogen ambient atmosphere (1600° C, 1 hr) | 45 | 3.93 | 4,500 |
| Substrate of the present invention | In air (1525° C, 2 hr) | 77 | 3.95 | 5,100 |
| | In hydrogen ambient atmosphere (1600° C, 1 hr) | 76 | 3.97 | 5,500 |

In Table 1, the gloss 45 corresponds to the surface finish of about 0.08 $\mu$m CLA and the substrate with gloss of 76 to 77 has the surface finish of 0.03 to 0.04 $\mu$m CLA.

As is obvious from the above measuring results, that an alumina substrate having excellent characteristics of surface smoothness, density and flexural strength can be obtained by means of the present invention.

With reference to an alumina substrate (in the fired condition) currently available on the market, having the most excellent surface smoothness, shows surface gloss of 30 to 40. However, since the substrate of this kind has been fired at a temperature as low as 1400° C to 1500° C where the grain growth is limited, it is degraded in density due to insufficient sintering, resulting in a density of only 3.8 g/cm$^3$. The substrate prepared above for comparison may be said to be excellent when compared with the currently available ones by reason of the excellent composition of the organic agent and the comparatively high density to which the raw material powder is packed in the green sheet. Here, if the alumina powder used as the raw material powder includes several percents of $\gamma$-alumina, there is no variation in the results obtained when density of the green sheet is made more than 2.65 g/cm$^3$.

EMBODIMENT NO. 2

Raw material powder was prepared by adding 0.2 wt% of the magnesium oxide (MgO) to the alumina powder (Alcoa A-16SG) used in embodiment No. 1. Then, the organic agent composition No. 2 was added to 100 parts of several kinds of raw material powders for which dry milling was performed for different times. Milling with a ball mill was then performed using an alumina ball weighing 3 times the raw material powder contained within the mill pot. Specifically, six kinds of slips were prepared by performing the milling for the times as specified in Table 2. The specimen, which was subjected to dry milling for 40 hours, has 1 wt% of water added to the raw material powder before the slips were prepared.

| Composition of organic agent No. 2: | |
|---|---|
| Binder: PVB | 7.5 parts |
| Plasticizer: DBP | 10 parts |
| Deflocculent: Sorbitan trioleate | 1 part |
| Solvent: MEK, methanol, butanol | 40 parts |

Each slip was placed under a vacuum condition for the purpose of removing bubbles. At the same time, each slip was formed into a sheet on a polyester film having a smooth surface when the viscosity became appropriate, since the solvent in the slip was vaporized. The formed slips were left at room temperature condition and dried into green sheet specimens numbered from 1 to 6. The milling time of each specimen and density of the green sheets are shown in Table 2.

TABLE 2

| Specimen No. | Dry Milling time | Milling time after adding the organic agent | Density of green sheet (g/cm³) |
|---|---|---|---|
| 1 | 0 | 48 hr. | 2.47 |
| 2 | 0 | 96 hr. | 2.49 |
| 3 | 10 hr. | 48 hr. | 2.57 |
| 4 | 10 hr. | 72 hr. | 2.60 |
| 5 | 40 hr. | 96 hr. | 2.70 |
| 6 | 40 hr. | 120 hr. | 2.71 |

The green sheets 3 and 4 have generated phase separation and these generated a pattern consisting of comparatively low density area and high density area. This phase separation can be avoided by sufficiently performing the milling as in the cases of the specimens 5 and 6 or by regulating the water content in the slip to a range of from 0.3 to 3 wt%, or particularly to a range of from 0.5 to 2.0 wt% against the raw material powder.

Figure 3:
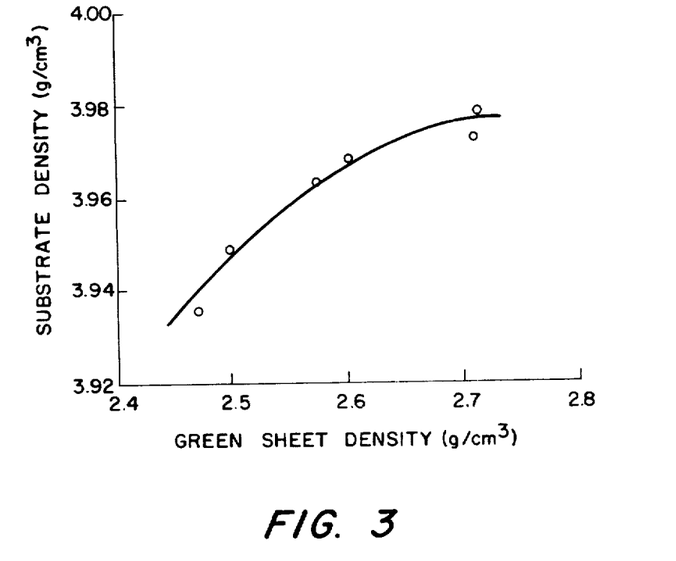
FIG. 3 is a graphical presentation showing the relation between the density of the green sheet and that of the corresponding alumina ceramic substrate.
Figure 4:
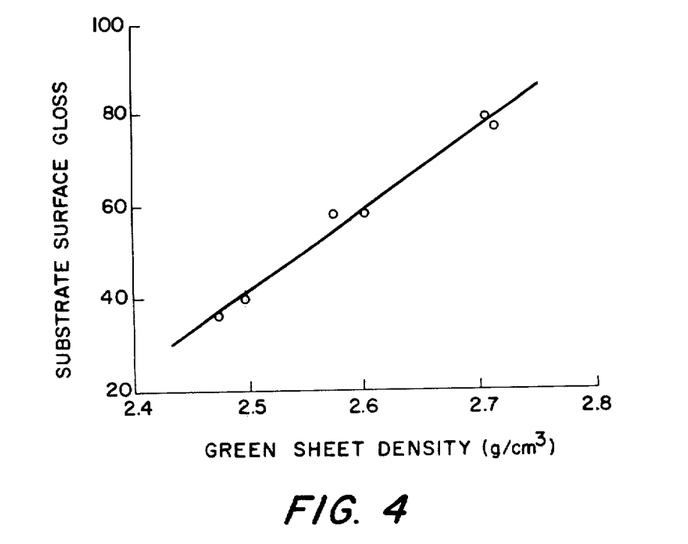
FIG. 4 is a graphical presentation showing the relation between the density of the green sheet and surface gloss of the alumina substrate obtained by the firing process.

After performing the calcine in air for each green sheet under a temperature of 1300° C for a period of 2 hours, they are fired for 1½ hour at 1600° C or for 4 hours (equivalent to 1½ hour of furnace time at 1600° C). The relationship between the ceramic substrate density and green sheet density obtained by the above firing is shown in FIG. 3. The relationship between surface gloss and green sheet density is shown in FIG. 4. From these FIGS. 3 and 4, it is clear that the substrate obtained from the high density green sheet excells substantially in density and surface smoothness.

The substrate of specimens 1 and 2 has a surface finish of about 0.08 μm CLA, while that of specimens 3 and 4, about 0.05 μm CLA and that of specimens 5 and 6, about 0.03 μm CLA.

Figure 5:
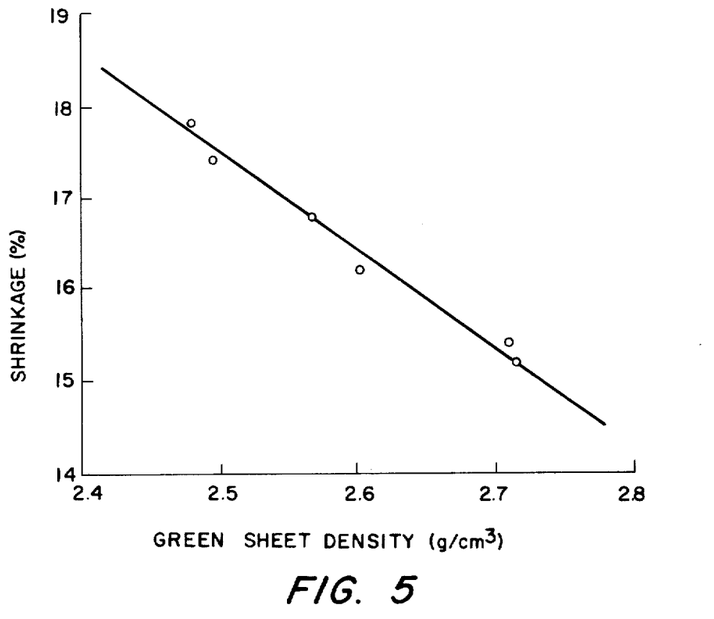
FIG. 5 is a graphical presentation showing the relation between the density of the green sheet and the shrinkage of the corresponding substrate during firing.

FIG. 5 shows the relationship between shrinkage (%) of volume during firing and green sheet density. As is clear from FIG. 5, the green sheet with the higher density shows less shrinkage during firing.

EMBODIMENT NO. 3

Figure 6:
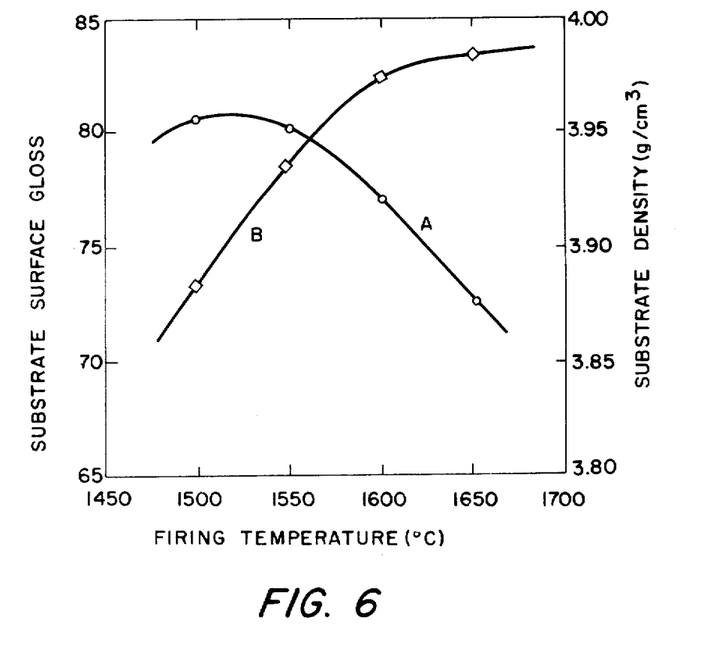
FIG. 6 is a graphical presentation showing the relation of firing temperature to surface gloss and of firing temperature to density of the alumina substrate.

After calcine was performed on the green sheet of specimen 6 in the embodiment No. 2, it was subjected to firing in a hydrogen atmosphere for 1½ hour at different temperatures. Various kinds of ceramic substrates were obtained. Respective relationships between firing temperature, surface gloss and density of this substrate are shown in FIG. 6. In FIG. 6, the curve A shows the surface gloss and B, substrate density. As is understood from FIG. 6, in the present invention, a ceramic substrate having the most excellent surface smoothness and density of 3.90 g/cm³ occurs when the firing temperature is selected at around 1525° C. At higher temperatures, the surface smoothness is gradually degraded. On the other hand, the ceramic substrate density improves as the firing temperature rises. However, the effect of improved density is saturated when the firing temperature becomes higher than 1650° C. Therefore, the firing temperature should be selected within the temperature range from 1525° C to 1650° C for obtaining a ceramic substrate having a high density and excellent surface smoothness.

In this embodiment, the shrinkage due to the firing was 14.9% when the firing temperature of 1500° C; 15.2% at 1550° C; 15.4 at 1600° C; and 15.6 at 1650° C.

EMBODIMENT NO. 4

For comparison with the green sheet of specimen 6 manufactured in embodiment No. 2, after calcine two green sheets of specimen 1 were respectively fired for 1 hour in a hydrogen atmosphere at 1500° C and 1600° C, and formed into a ceramic substrates. An electronic microscope was used for observing fine surface structure of each ceramic substrate. The microscope photographs are shown in FIGS. 7a, 7b, 8a, and 8b. FIGS. 7a and 7b show the ceramic substrate surfaces which have been obtained by firing the two green sheets of specimen 1 at the temperatures of 1500° C and 1600° C, respectively. FIGS. 8a and 8b show the ceramic substrate surfaces which have been obtained by firing green sheets of specimen 6 at the temperatures of 1500° C and 1600° C respectively. By comparing FIG. 7a with FIG. 7b it is clear that the surface smoothness of specimen 1 is degraded by grain growth when fired at 1600° C and many pores are generated which appear as pin holes. However, the alumina substrate of the present invention, as shown in FIG. 8b is obtained by firing a green sheet of specimen 6 at the temperature of 1600° C. The surface smoothness is maintained in spite of allowing generation of grain growth, and a few large pores and projections develop.

The alumina substrate shown in FIG. 7b has a surface gloss of 41 and a density of 3.94 g/cm³, while the alumina substrate of the present invention shown in FIG. 8b has a surface gloss of 76 and a density of 3.97 g/cm³.

The average grain size of the alumina substrate obtained from the specimen 6 when changing the firing temperature is indicated in Table 3.

TABLE 3

| Firing temperature (° C) | 1550 | 1600 | 1650 |
|---|---|---|---|
| Average grain size (μm) | 1.73 | 2.45 | 2.72 |

EMBODIMENT NO. 5

After performing the calcine for the green sheet of the specimen 6 prepared for the embodiment No. 2, a ceramic substrate was obtained by firing that green sheet in air for 2 hours. Then, measurements were made for surface gloss, density, shrinkage and average grain size. The results of these measurements are shown in Table 4.

TABLE 4

| Firing temp. | Surface Gloss | Density (g/cm³) | Shrinkage (%) | Average grain size (μm) |
|---|---|---|---|---|
| 1525° C | 75 | 3.95 g/cm³ | 15.2% | 1.7 μm |
| 1550° C | 70 | 3.98 g/cm³ | 15.4% | 2.6 μm |
| 1600° C | 67 | 3.98 g/cm³ | 15.6% | 4.0 μm |

The results shown in Table 4 prove it is possible to obtain an alumina substrate having a surface finish of no more than 0.05 μm CLA and density of at least 3.95 g/cm³ even when the firing is performed in air.

It will be apparent that many modifications and variations may be effected without departing from the scope of the novel concept of this invention. Therefore, it is intended by the appended claims to cover all such modifications and variations which fall within the true spirit and scope of the invention.

What is claimed is:

1. A method of manufacturing an alumina substrate having a surface finish of no more than 0.05 μm center line average on at least one major surface and a density of at least 3.90 g/cm³ in an as-fired condition, comprising the steps of:
- making an aggregated raw material powder by dry milling a mixture consisting of fine alumina particles, having high purity, and a grain growth inhibitor of 0.1 to 0.5 wt%;
- producing a slip consisting of said aggregated raw material powder and an organic agent comprising a binder and a solvent; said solvent is provided to ensure that said raw material powder is uniformly dispersed in said slip;
- forming a solvent-free green sheet from said slip, having a high content of said raw material powder and a density of more than 2.60g/cm³, said step of forming including the step of subjecting said slip to a vacuum to eliminate bubbles and evaporate said solvent from said slip, followed by the step of shaping said solvent-free slip into a sheet and the further step of drying said sheet at room temperature; and firing said green sheet at a temperature in the range of 1525° C to 1650° C until said alumina particles in said fired sheet grow sufficiently to form straight boundaries and flat surfaces corresponding to said major surface of said alumina substrate.

2. A method of manufacturing an alumina substrate as in claim 1 wherein said step of firing said green sheet is performed so that said alumina particles grow 3 to 8 times their normal size.

3. A method of manufacturing an alumina substrate as in claim 1, wherein said step of making an aggregated raw material by dry milling is performed for more than 10 hours with a ball mill.

4. A method of manufacturing an alumina substrate as in claim 1 wherein said raw material powder contains water which is regulated to be 0.3 to 3.0 wt%.

5. A method of manufacturing an alumina substrate as in claim 1 wherein said step of making an aggregated raw material powder includes the step of using magnesium oxide as said grain growth inhibitor.

6. A method of manufacturing an alumina substrate as in claim 1 wherein said step of making an aggregated raw material powder includes the steps of supplying fine alumina particles which have an average size of less than 0.8 μm.

7. A method of manufacturing an alumina substrate as in claim 1 wherein said step of firing said green sheet is carried out in a hydrogen atmosphere.

8. A method of manufacturing an alumina substrate as in claim 1 wherein said step of firing said green sheet is carried out in air.

9. A method of manufacturing an alumina substrate as in claim 1 wherein said step of producing a slip consisting of said aggregated raw material powder and an organic agent includes providing an organic agent comprising a binder of polyvinyl butyral, a plasticizer of dibuthyl phthalate, a deflocculent of sorbitan trioleate and a solvent of methyl ethyl ketone, methanol and buthanol.

10. A method of manufacturing an alumina substrate as in claim 9, wherein said step of making an aggregated raw material powder by dry milling is performed for 40 hours with a ball mill.

11. A method of manufacturing an alumina substrate as in claim 10 wherein said step of producing a slip includes milling said aggregated raw material powder and said organic agent.

12. A method of manufacturing an alumina substrate as in claim 11 wherein said step of producing a slip includes milling said aggregated raw material powder and said organic agent for more than 100 hours.

13. A method of manufacturing an alumina substrate as in claim 11 wherein said step of producing a slip includes milling said aggregated raw material powder and said organic agent for about 120 hours.

* * * * *